US012771314B2

(12) United States Patent
Taniguchi et al.

(10) Patent No.: US 12,771,314 B2
(45) Date of Patent: Oct. 20, 2026

(54) ACOUSTIC WAVE DEVICE

(71) Applicant: Murata Manufacturing Co., Ltd., Nagaokakyo (JP)

(72) Inventors: Yasumasa Taniguchi, Nagaokakyo (JP); Hideki Iwamoto, Nagaokakyo (JP); Hiromu Okunaga, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 680 days.

(21) Appl. No.: 18/227,333

(22) Filed: Jul. 28, 2023

(65) Prior Publication Data

US 2023/0387881 A1 Nov. 30, 2023

Related U.S. Application Data

(63) Continuation of application No. PCT/JP2022/013625, filed on Mar. 23, 2022.

(30) Foreign Application Priority Data

Mar. 26, 2021 (JP) ................................ 2021-053559

(51) Int. Cl.
*H03H 9/145* (2006.01)
*H03H 9/25* (2006.01)

(52) U.S. Cl.
CPC .............. *H03H 9/145* (2013.01); *H03H 9/25* (2013.01)

(58) Field of Classification Search
CPC ...... H03H 9/145; H03H 9/25; H03H 9/02574; H03H 9/02559; H03H 9/02669; H03H 9/02866; H03H 9/1452; H03H 9/14538; H03H 9/14541
See application file for complete search history.

(56) References Cited

U.S. PATENT DOCUMENTS

| | | | | |
|---|---|---|---|---|
| 7,522,020 | B2 * | 4/2009 | Kando | H03H 9/0222 333/194 |
| 10,979,019 | B2 * | 4/2021 | Giner De Haro | H03H 9/145 |
| 12,413,200 | B2 * | 9/2025 | Inoue | H03H 9/174 |

(Continued)

FOREIGN PATENT DOCUMENTS

| | | | | |
|---|---|---|---|---|
| CN | 111434037 A | | 7/2020 | |
| CN | 116868508 A | * | 10/2023 | H03H 9/14541 |

(Continued)

OTHER PUBLICATIONS

International Search Report in PCT/JP2022/013625, mailed May 31, 2022, 3 pages.

(Continued)

*Primary Examiner* — Pedro J Cuevas
(74) *Attorney, Agent, or Firm* — Keating & Bennett, LLP

(57) ABSTRACT

An acoustic wave device includes a support including a support substrate, a piezoelectric layer provided on the support and including a first principal surface and a second principal surface facing each other, a first IDT electrode provided on the first principal surface, and a second IDT electrode provided on the second principal surface. The second IDT electrode is embedded in the support. At least one cavity is provided in a periphery of a portion of the support in which electrode fingers of the second IDT electrode is embedded.

20 Claims, 8 Drawing Sheets

(56) References Cited

U.S. PATENT DOCUMENTS

| | | | | |
|---|---|---|---|---|
| 12,574,004 | B2 * | 3/2026 | Okunaga | H03H 9/132 |
| 2007/0267942 | A1 | 11/2007 | Matsumoto et al. | |
| 2008/0106354 | A1 | 5/2008 | Kando | |
| 2014/0145556 | A1 | 5/2014 | Kadota | |
| 2016/0182007 | A1 | 6/2016 | Bhattacharjee | |
| 2016/0352304 | A1 | 12/2016 | Kadota et al. | |
| 2017/0222619 | A1 | 8/2017 | Iwamoto et al. | |
| 2020/0295730 | A1 | 9/2020 | Nagatomo et al. | |
| 2020/0373910 | A1 * | 11/2020 | Yantchev | H03H 3/04 |
| 2023/0318563 | A1 * | 10/2023 | Ouchi | H03H 9/02228 310/349 |
| 2023/0327639 | A1 * | 10/2023 | Inoue | H03H 9/02086 333/187 |
| 2024/0007081 | A1 * | 1/2024 | Iwamoto | H03H 9/1452 |
| 2024/0048117 | A1 * | 2/2024 | Nakamura | H03H 9/02228 |
| 2024/0048118 | A1 * | 2/2024 | Nagatomo | H03H 9/02574 |
| 2024/0162878 | A1 * | 5/2024 | Taniguchi | H03H 9/02039 |
| 2024/0171151 | A1 * | 5/2024 | Okunaga | H03H 9/132 |
| 2025/0015784 | A1 * | 1/2025 | Nagatomo | H03H 9/173 |
| 2025/0023546 | A1 * | 1/2025 | Daimon | H03H 9/02228 |
| 2025/0150057 | A1 * | 5/2025 | Okunaga | H03H 9/02992 |
| 2026/0081578 | A1 * | 3/2026 | Daimon | H03H 9/13 |
| 2026/0128721 | A1 * | 5/2026 | Kuroda | H03H 9/02015 |
| 2026/0128724 | A1 * | 5/2026 | Hayashi | H03H 9/145 |
| 2026/0142641 | A1 * | 5/2026 | Lee | H03H 9/02992 |

FOREIGN PATENT DOCUMENTS

| | | | | | |
|---|---|---|---|---|---|
| CN | 116888892 | A | * | 10/2023 | H03H 9/145 |
| CN | 117597865 | A | * | 2/2024 | H03H 9/25 |
| CN | 119422327 | A | * | 2/2025 | H03H 9/02228 |
| DE | 112022001794 | T5 | * | 2/2024 | H03H 9/14541 |
| JP | 05145363 | A | | 6/1993 | |
| JP | 2005217818 | A | | 8/2005 | |
| JP | 2007312164 | A | | 11/2007 | |
| JP | 2008236588 | A | | 10/2008 | |
| JP | 2010220204 | A | | 9/2010 | |
| JP | 2012015767 | A | | 1/2012 | |
| JP | 2018506930 | A | | 3/2018 | |
| KR | 20230146600 | A | * | 10/2023 | H03H 9/14541 |
| KR | 102851665 | B1 | * | 8/2025 | H03H 9/25 |
| WO | WO-2007007462 | A1 | * | 1/2007 | H03H 9/0222 |
| WO | 2013021948 | A1 | | 2/2013 | |
| WO | 2015137054 | A1 | | 9/2015 | |
| WO | 2016084526 | A1 | | 6/2016 | |
| WO | WO-2022202916 | A1 | * | 9/2022 | H03H 9/145 |
| WO | WO-2022202917 | A1 | * | 9/2022 | H03H 9/14541 |
| WO | WO-2024014167 | A1 | * | 1/2024 | H03H 9/02228 |

OTHER PUBLICATIONS

Written Opinion in PCT/JP2022/013625, mailed May 31, 2022, 3 pages.

Official Communication issued in corresponding Chinese Patent Application No. 202280015611.6, mailed on Jun. 11, 2026, 7 pages.

* cited by examiner

ACOUSTIC WAVE DEVICE

CROSS REFERENCE TO RELATED APPLICATIONS

This application claims the benefit of priority to Japanese Patent Application No. 2021-053559 filed on Mar. 26, 2021 and is a Continuation Application of PCT Application No. PCT/JP2022/013625 filed on Mar. 23, 2022. The entire contents of each application are hereby incorporated herein by reference.

BACKGROUND OF THE INVENTION

1. Field of the Invention

The present invention relates to an acoustic wave device.

2. Description of the Related Art

Hitherto, an acoustic wave device has been widely used in a filter of mobile phones, and the like. International Publication No. 2013/021948 discloses an example of an acoustic wave device using a plate wave. In this acoustic wave device, a $LiNbO_3$ substrate is provided on a support body. The support body is provided with a through-hole. IDT electrodes are provided on both surfaces of the $LiNbO_3$ substrate in a portion of the $LiNbO_3$ substrate facing the through-hole.

SUMMARY OF THE INVENTION

However, in the acoustic wave device disclosed in International Publication No. 2013/021948, it is difficult to suppress spurious emission outside a pass band and maintain electrical characteristics within the pass band at the same time. In a case where the acoustic wave device is used in a band pass filter, when the spurious emission occurs, filter characteristics outside the pass band may be deteriorated. In a case where the band pass filter using the acoustic wave device is further used in a duplexer, a multiplexer, or the like, when the spurious emission occurs, insertion loss of another filter device commonly connected to an antenna may be affected.

Preferred embodiments of the present invention provide acoustic wave devices each capable of effectively suppressing spurious emission.

An acoustic wave device according to a preferred embodiment of the present invention includes a support including a support substrate, a piezoelectric layer provided on the support and including a first principal surface and a second principal surface facing each other, a first IDT electrode provided on the first principal surface and including a plurality of electrode fingers, and a second IDT electrode provided on the second principal surface and including a plurality of electrode fingers. The second IDT electrode is embedded in the support, and at least one cavity is provided in a periphery of a portion of the support in which the plurality of electrode fingers of the second IDT electrode is embedded.

With acoustic wave devices according to preferred embodiments of the present invention, spurious emission can be effectively suppressed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the accompanying drawings to clarify the present invention.

Note that the preferred embodiments described in the present specification are merely examples, and partial replacement or combination of configurations is possible between different preferred embodiments.

Figure 1:
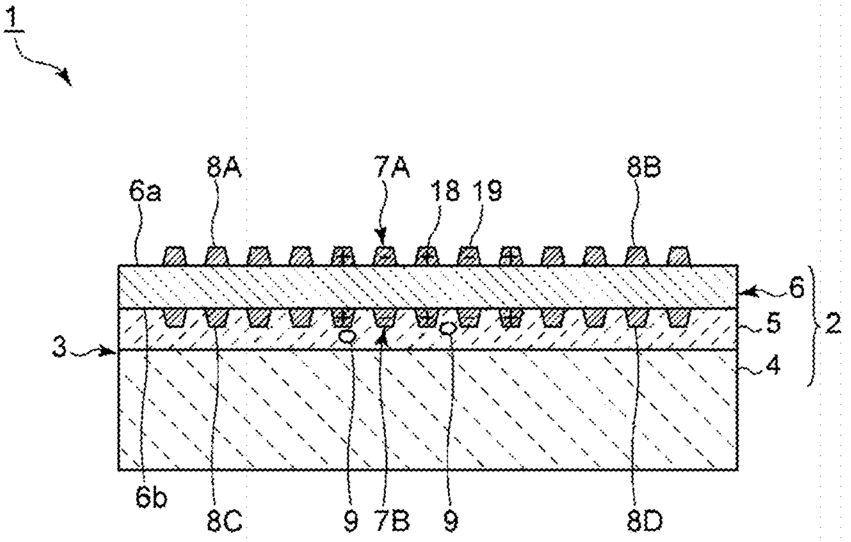
FIG. 1 is a schematic elevational cross-sectional view of an acoustic wave device according to a first preferred embodiment of the present invention.
Figure 2:
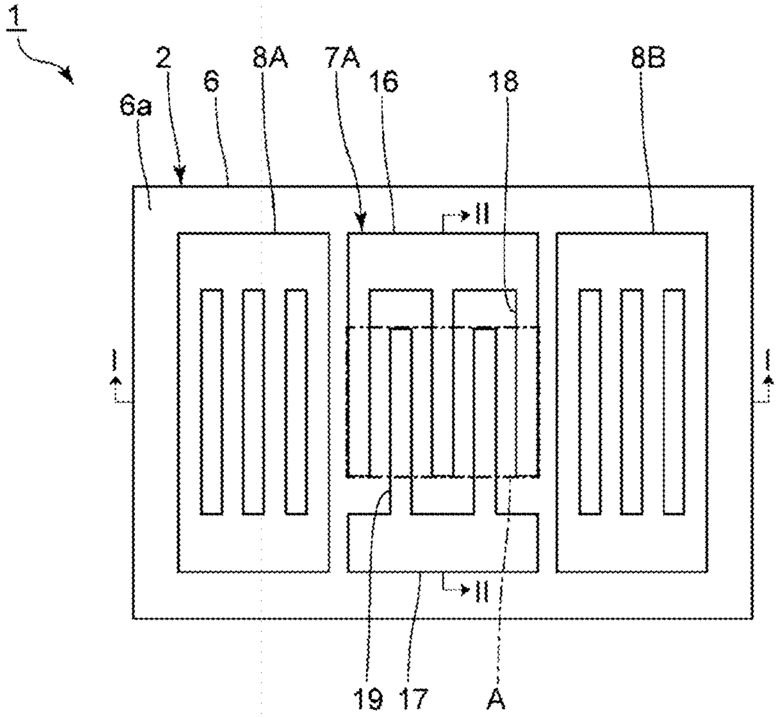
FIG. 2 is a schematic plan view of the acoustic wave device according to the first preferred embodiment of the present invention.
Figure 3:
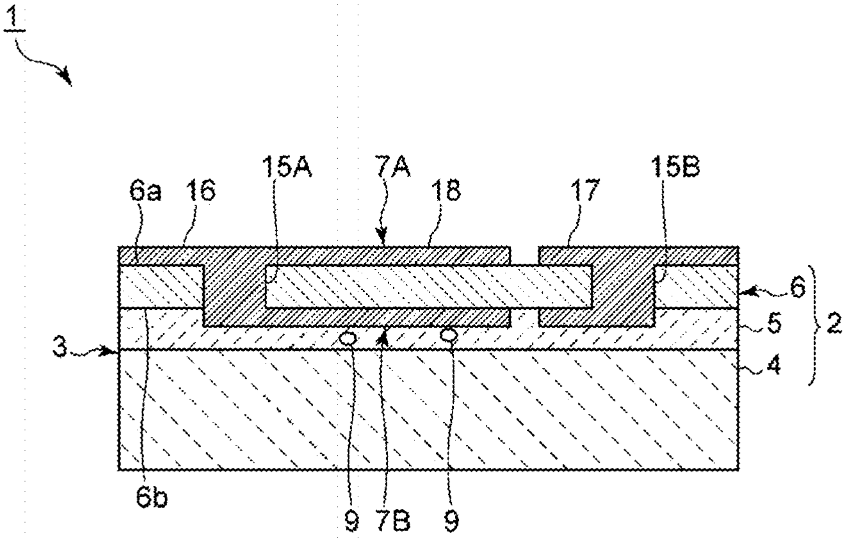
FIG. 3 is a cross-sectional view taken along a line II-II in FIG. 2.

FIG. 1 is a schematic elevational cross-sectional view of an acoustic wave device according to a first preferred embodiment of the present invention. FIG. 2 is a schematic plan view of the acoustic wave device according to the first preferred embodiment of the present invention. FIG. 3 is a cross-sectional view taken along a line II-II in FIG. 2. Note that FIG. 1 is a cross-sectional view taken along a line I-I in FIG. 2. Signs of + and − in FIG. 1 schematically indicate the relative magnitude of a potential.

As illustrated in FIG. 1, the acoustic wave device 1 includes a piezoelectric substrate 2. The piezoelectric substrate 2 includes a support member 3 and a piezoelectric layer 6. In addition, the support member 3 includes a support substrate 4 and a dielectric layer 5. To be more specific, the dielectric layer is provided on the support substrate 4. The piezoelectric layer 6 is provided on the dielectric layer 5. However, the support member 3 may be defined by only the support substrate 4.

The piezoelectric layer 6 includes a first principal surface 6*a* and a second principal surface 6*b*. The first principal surface 6*a* and the second principal surface 6*b* face each other. A first IDT electrode 7A is provided on the first principal surface 6*a*. A second IDT electrode 7B is provided on the second principal surface 6*b*. The first IDT electrode 7A and the second IDT electrode 7B face each other with the piezoelectric layer 6 in between.

The second principal surface 6*b* of the piezoelectric layer 6 is bonded to the support member 3. The second IDT electrode 7B is embedded in the support member 3. In other words, the support member 3 includes a portion facing the second IDT electrode 7B. To be more specific, in the present preferred embodiment, the second IDT electrode 7B is embedded in the dielectric layer 5. A plurality of cavities 9 is provided in a periphery of portions of the dielectric layer 5 in which a plurality of electrode fingers of the second IDT electrode 7B is embedded. It is sufficient that at least one cavity 9 is provided. In the present preferred embodiment, the cavity 9 has an elliptically spherical shape or a substantially elliptically spherical shape. However, the shape of the cavity 9 is not limited to the above.

An acoustic wave is excited by applying an AC voltage to the first IDT electrode 7A and the second IDT electrode 7B. The acoustic wave device 1 uses a Shear Horizontal or SH mode as a main mode. On the first principal surface 6*a* of the piezoelectric layer 6, a pair of reflectors 8A and 8B are provided on both sides of the first IDT electrode 7A in an acoustic wave propagation direction. Similarly, a pair of reflectors 8C and 8D are provided on the second principal surface 6*b* on both sides of the second IDT electrode 7B in the acoustic wave propagation direction. As described above, the acoustic wave device 1 is a surface acoustic wave resonator. Acoustic wave devices according to preferred embodiments of the present invention may be used in a band pass filter, a duplexer, a multiplexer, and the like.

As illustrated in FIG. 2, the first IDT electrode 7A includes a first busbar 16, a second busbar 17, a plurality of first electrode fingers 18, and a plurality of second electrode fingers 19. The first busbar 16 and the second busbar 17 face each other. One end of each of the plurality of first electrode fingers 18 is connected to the first busbar 16. One end of each of the plurality of second electrode fingers 19 is connected to the second busbar 17. The plurality of first electrode fingers 18 and the plurality of second electrode fingers 19 are interdigitated with each other.

Similar to the first IDT electrode 7A, the second IDT electrode 7B includes a pair of busbars and a plurality of electrode fingers. The first IDT electrode 7A and the second IDT electrode 7B have the same electrode finger pitch. Note that the electrode finger pitch is a distance between the centers of adjacent ones of the electrode fingers. In the present specification, the phrase "the electrode finger pitches are the same" includes a case where the electrode finger pitches are different within an error range that does not affect the electrical characteristics of the acoustic wave device. As illustrated in FIG. 1, the cross-sectional shape of each of the electrode fingers of the first IDT electrode 7A and the second IDT electrode 7B is trapezoidal. However, the cross-sectional shape of each of the electrode fingers is not limited to that described above, and may be, for example, a rectangle.

The first IDT electrode 7A, the second IDT electrode 7B, the reflector 8A, the reflector 8B, the reflector 8C, and the reflector 8D are made of Al. However, the materials of each of the IDT electrodes and each of the reflectors are not limited to the material described above. Alternatively, each of the IDT electrodes and each of the reflectors may be formed of a laminated metal film. Note that, in the present specification, when it is described that the IDT electrode or the like is made of a specific material such as Al, a case where the IDT electrode or the like contains a very small amount of impurities that do not affect the electrical characteristics of the acoustic wave device is also included.

In the first IDT electrode 7A, a region in which adjacent ones of the electrode fingers overlap each other when viewed from the acoustic wave propagation direction is an intersection region A. Similarly, the second IDT electrode 7B also has an intersection region. The intersection region A of the first IDT electrode 7A and the intersection region of the second IDT electrode 7B overlap each other in plan view. To be more specific, the center of the plurality of electrode fingers in the intersection region A of the first IDT electrode 7A and the center of the plurality of electrode fingers in the intersection region of the second IDT electrode 7B overlap each other in plan view. However, it is sufficient that at least a portion of the plurality of electrode fingers of the first IDT electrode 7A and at least a portion of the plurality of electrode fingers of the second IDT electrode 7B overlap each other in plan view. In other words, it is sufficient if the overlapping state is within an error range in which the electrical characteristics of the acoustic wave device are not affected. A deviation due to manufacturing variations is regarded as being overlapped. Here, plan view refers to a direction viewed from above in FIG. 1.

As illustrated in FIG. 3, the acoustic wave device 1 includes a first through electrode 15A and a second through electrode 15B. The first through electrode 15A and the second through electrode 15B penetrate the piezoelectric layer 6. The first through electrode 15A connects the first busbar 16 of the first IDT electrode 7A and one busbar of the second IDT electrode 7B. The second through electrode 15B connects the second busbar 17 of the first IDT electrode 7A and the other busbar of the second IDT electrode 7B. With this, the electrode fingers facing each other with the piezoelectric layer 6 in between have the same potential. However, the busbars may be connected to the same signal potential by wiring other than corresponding one of the through electrodes.

As illustrated in FIG. 1, the potential of the plurality of first electrode fingers 18 is relatively higher than the potential of the plurality of second electrode fingers 19. However, the potential of the plurality of second electrode fingers 19 may be relatively higher than the potential of the plurality of first electrode fingers 18.

The present preferred embodiment is featured to have the following configurations 1) to 3). 1) The first IDT electrode 7A and the second IDT electrode 7B face each other with the piezoelectric layer 6 in between, and the electrode fingers overlapping each other in plan view are connected to the same potential. 2) The second IDT electrode 7B is embedded in the support member 3. 3) At least one cavity 9 is provided in a periphery of a portion of the support member 3 in which the plurality of electrode fingers of the second IDT electrode 7B is embedded. By driving a portion where the first IDT electrode 7A is provided and a portion where the second IDT electrode 7B is provided in the same phase, spurious emission can be suppressed. In addition, since the second IDT electrode 7B is embedded in the support member 3, an unnecessary wave can be leaked to a support member 3 side. Further, spurious energy can be scattered by the cavity 9. Therefore, the spurious emission can be further suppressed. Details of this effect will be described below together with details of the configuration of the present preferred embodiment.

The piezoelectric layer 6 is a lithium tantalate layer. More specifically, cut-angles of lithium tantalate used for the piezoelectric layer 6 is 30° Y-cut X-propagation. However, the material and the cut-angles of the piezoelectric layer 6 are not limited to those described above. The piezoelectric layer 6 may be, for example, a lithium niobate layer. The piezoelectric layer 6 has crystal axes ($X_{Li}$, $Y_{Li}$, $Z_{Li}$).

When a wavelength defined by electrode finger pitches of the first IDT electrode 7A and the second IDT electrode 7B is represented by λ, a thickness of the piezoelectric layer 6 is preferably equal to or less than about 2λ and more preferably equal to or less than about 1λ, for example. In these cases, the acoustic wave can be efficiently excited.

Figure 4:
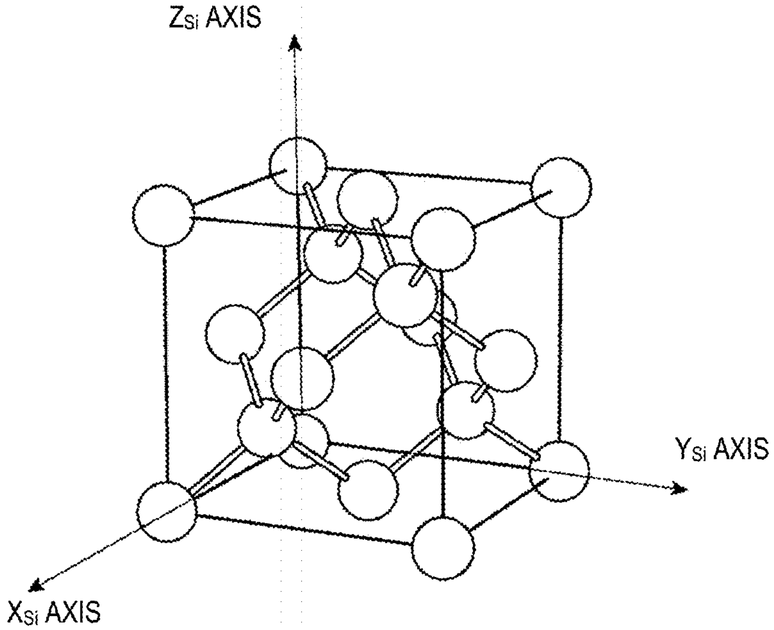
FIG. 4 is a schematic view illustrating the definition of crystal axes of silicon.
Figure 5:
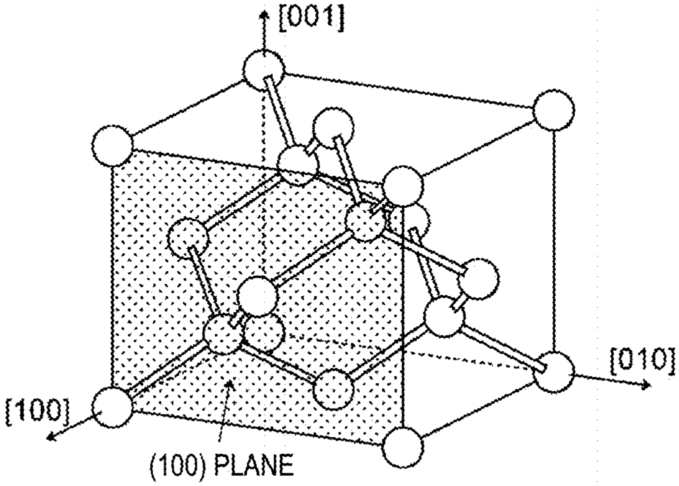
FIG. 5 is a schematic view illustrating a (100) plane of silicon.

The support substrate 4 is a silicon substrate. As illustrated in FIG. 4, silicon has a diamond structure. In the present specification, crystal axes of silicon of the silicon substrate is ($X_{si}$, $Y_{si}$, $Z_{si}$). In silicon, the $X_{si}$, axis, the $Y_{si}$ axis and the $Z_{si}$ axis are equivalent to each other due to the symmetry of the crystal structure. In the present preferred embodiment, a plane orientation of the support substrate 4 is (100). The plane orientation of (100) indicates that the substrate is cut along a (100) plane orthogonal to the crystal axis represented by Miller indices in the crystal structure of silicon having the diamond structure. In the (100) plane, the (100) plane is 4-fold symmetry, and an equivalent crystal structure is obtained by 90° rotation. Note that the (100) plane is the plane illustrated in FIG. 5.

Figure 6:
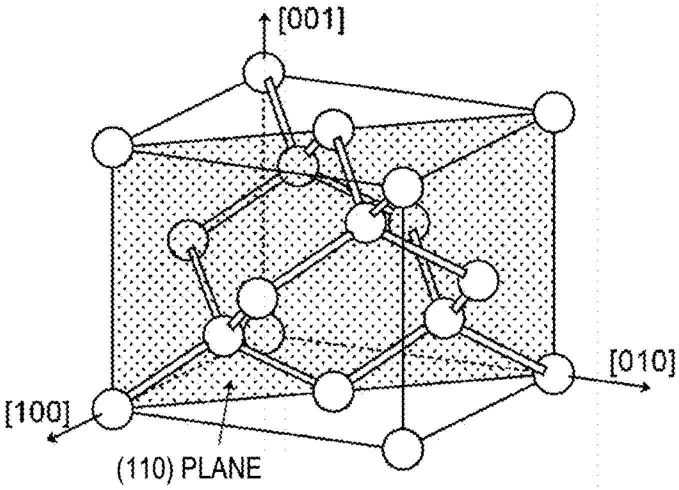
FIG. 6 is a schematic view illustrating a (110) plane of silicon.

The support substrate 4 and the piezoelectric layer 6 are laminated so that the $X_{Li}$ axis direction and an Si direction are parallel to each other. The Si direction is a direction orthogonal to a (110) plane illustrated in FIG. 6. However, the orientation relationship between the support substrate 4 and the piezoelectric layer 6 is not limited to that described above. The plane orientation and material of the support substrate 4 are not limited to what is described above. For example, glass, a quartz crystal, alumina, or the like may be used in the support substrate 4.

The dielectric layer 5 is a silicon oxide layer. However, the material of the dielectric layer 5 is not limited to the above, for example, silicon nitride, silicon oxynitride, lithium oxide, tantalum pentoxide, or the like may be used.

The cavity 9 illustrated in FIG. 1 is provided in the periphery of the portion of the support member 3 in which the plurality of electrode fingers of the second IDT electrode 7B is provided. To be more specific, a distance between the cavity 9 and an electrode finger, of the plurality of electrode fingers of the second IDT electrode 7B, closest to the cavity 9 is, for example, equal to or less than about 1λ, for example. When a plurality of cavities 9 is provided, a distance relationship between each of the cavities 9 and the second IDT electrode 7B is preferably within the above-described range.

The maximum dimension of the cavity 9 is, for example, equal to or less than about 1λ (wave propagation direction (X-propagation)), for example. When the plurality of cavities 9 is provided, the maximum dimension of each of the cavities 9 is preferably within the above-described range.

The cavity 9 can be provided by, for example, a method of forming a cavity by forming a sacrificial layer and then removing the sacrificial layer.

Figure 7:
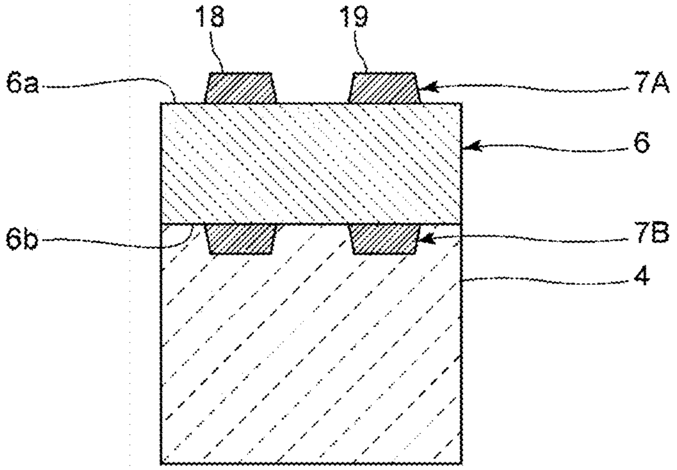
FIG. 7 is a schematic elevational cross-sectional view illustrating a vicinity of a pair of electrode fingers of each of a first IDT electrode and a second IDT electrode in an acoustic wave device of a reference example.
Figure 8:
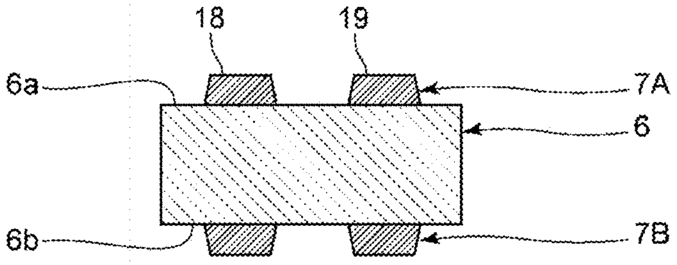
FIG. 8 is a schematic elevational cross-sectional view illustrating a vicinity of a pair of electrode fingers of each of a first IDT electrode and a second IDT electrode in an acoustic wave device of a comparative example.

Hereinafter, by comparing the present preferred embodiment, a reference example, and a comparative example, it will be described that the spurious emission can be effectively suppressed in the present preferred embodiment. As illustrated in FIG. 7, the reference example is different from the first preferred embodiment in that the support member is formed only of the support substrate 4 and the cavity is not provided. As illustrated in FIG. 8, the comparative example is different from the first preferred embodiment in that the second IDT electrode 7B is not embedded in the support member. Further, the comparative example is different from the first preferred embodiment in that a portion of the piezoelectric layer 6 overlapping the intersection region in plan view is not laminated with the support member.

Phase characteristics were compared by performing simulation in the first preferred embodiment, the reference example, and the comparative example. Design parameters of each acoustic wave device were as follows. Note that, in the comparative example, a portion of the piezoelectric layer 6 overlapping the intersection region in plan view is not laminated with the support member. Therefore, in the comparative example, design parameters of the support member are not set.

Design parameters of the acoustic wave device 1 of a non-limiting example of the first preferred embodiment are as follows. Note that, in the first IDT electrode 7A and the second IDT electrode 7B, the electrode fingers overlapping each other in plan view have the same potential.

Support substrate 4; material: Si, plane orientation: (100) plane

Dielectric layer 5; material: $SiO_2$, thickness: 0.185λ

Piezoelectric layer 6; material: $LiTaO_3$, cut-angles: 30° Y-cut X-propagation, thickness: 0.2λ

Orientation relationship between the support substrate 4 and the piezoelectric layer 6; the Si direction and the $X_{Li}$ axis direction are parallel to each other.

First IDT electrode 7A; material: Al, thickness: 0.07λ, duty ratio: 0.5

Second IDT electrode 7B; material: Al, thickness: 0.07λ, duty ratio: 0.5

Wavelength λ; 1 μm

Design parameters of the acoustic wave device of the reference example are as follows. Note that, in the first IDT electrode 7A and the second IDT electrode 7B, the electrode fingers overlapping each other in plan view have the same potential.

Support substrate 4; material: Si, plane orientation: (100) plane

Piezoelectric layer 6; material: $LiTaO_3$, cut-angles: 30° Y-cut X-propagation, thickness: 0.2λ

Orientation relationship between the support substrate 4 and the piezoelectric layer 6; the Si direction and the $X_{Li}$ axis direction are parallel to each other.

First IDT electrode 7A; material: Al, thickness: 0.07λ, duty ratio: 0.5

Second IDT electrode 7B; material: Al, thickness: 0.07λ, duty ratio: 0.5

Wavelength λ; 1 μm

Design parameters of the acoustic wave device of the comparative example are as follows. Note that, in the first IDT electrode 7A and the second IDT electrode 7B, the electrode fingers overlapping each other in plan view have the same potential.

Piezoelectric layer 6; material: $LiTaO_3$, cut-angles: 30° Y-cut X-propagation, thickness: 0.2λ

First IDT electrode 7A; material: Al, thickness: 0.07λ, duty ratio: 0.5

Second IDT electrode 7B; material: Al, thickness: 0.07λ, duty ratio: 0.5

Wavelength λ; 1 μm

Figure 9:
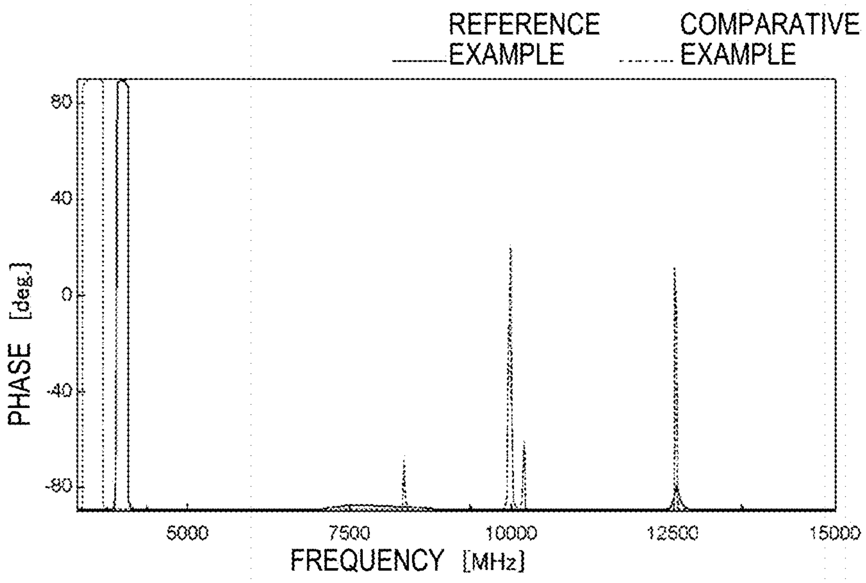
FIG. 9 is a diagram illustrating phase characteristics in the reference example and the comparative example.
Figure 10:
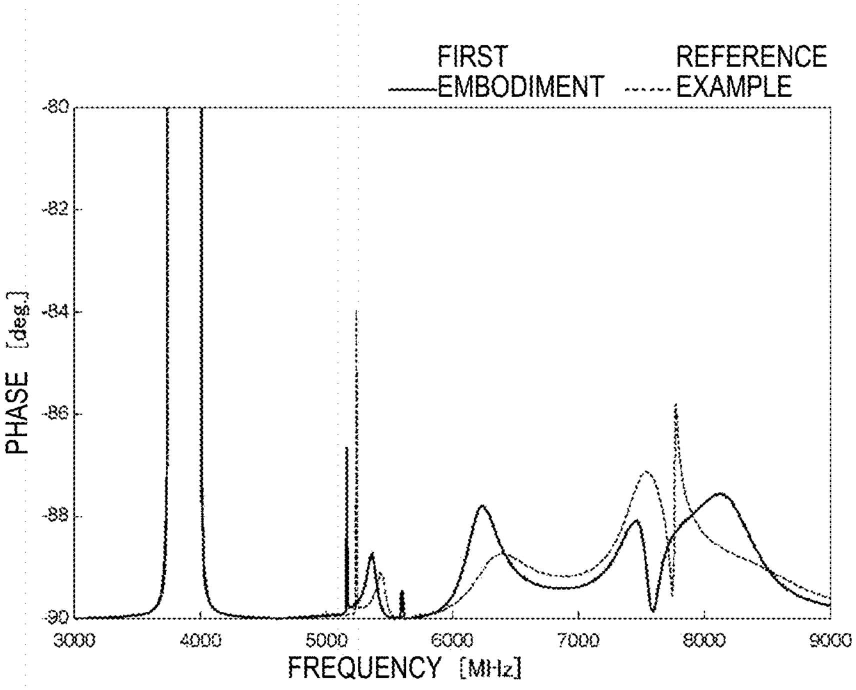
FIG. 10 is a diagram illustrating phase characteristics in the first preferred embodiment of the present invention and the reference example.

FIG. 9 is a diagram illustrating the phase characteristic in the reference example and the comparative example. FIG. 10 is a diagram illustrating the phase characteristic in the first preferred embodiment and the reference example.

As illustrated in FIG. 9, in the comparative example, the spurious emission occurs in a wide frequency band. As described above, even when the first IDT electrode 7A and the second IDT electrode 7B are facing each other, the spurious emission cannot be sufficiently suppressed. On the other hand, in the reference example, the spurious emission is suppressed. In particular, in the reference example, the spurious emission is significantly suppressed around 10000 MHz and around 12500 MHz as compared with the comparative example. In the reference example, the first IDT electrode 7A and the second IDT electrode 7B faces each other, and the second IDT electrode 7B is embedded in the support substrate 4. Thus, an unnecessary wave can be leaked to a support substrate 4 side. As a result, the spurious emission is suppressed as described above.

As illustrated in FIG. 10, it is understood that the spurious emission is further suppressed in the first preferred embodiment than in the reference example. In particular, in the first preferred embodiment, the spurious emission is more suppressed in around 5200 MHz and around 7700 MHz compared to the reference example. Also in the first preferred embodiment, an unnecessary wave can be leaked to the support member 3 side. In addition, since the cavity 9 is provided, the spurious energy can be scattered. Therefore, the spurious emission can be effectively suppressed.

Hereinafter, each of the modified examples of the first preferred embodiment will be described. In each of the modified examples as well, the spurious emission can be effectively suppressed as in the first preferred embodiment.

Figure 11:
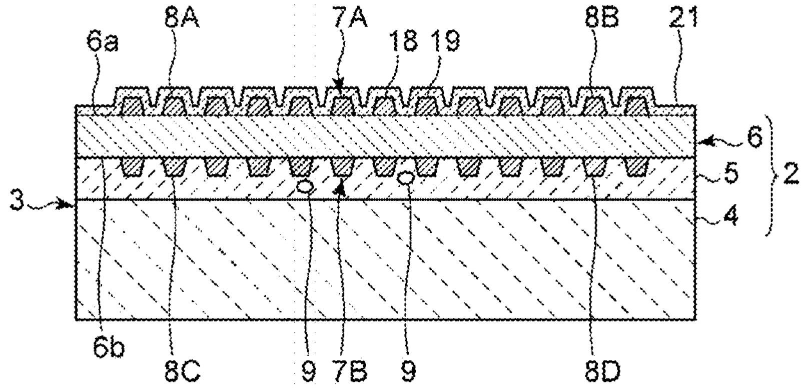
FIG. 11 is a schematic elevational cross-sectional view of the acoustic wave device according to a first modified example of the first preferred embodiment of the present invention.

In a first modified example illustrated in FIG. 11, a dielectric film 21 is provided on the first principal surface 6*a* of the piezoelectric layer 6 so as to cover the first IDT electrode 7A. As the material of the dielectric film 21, for example, silicon oxide, silicon nitride, silicon oxynitride, or the like can be used. A thickness of the dielectric film 21 is preferably thinner than the first IDT electrode 7A. As a result, the surface acoustic wave of the SH mode as the main mode can be suitably excited.

Figure 12:
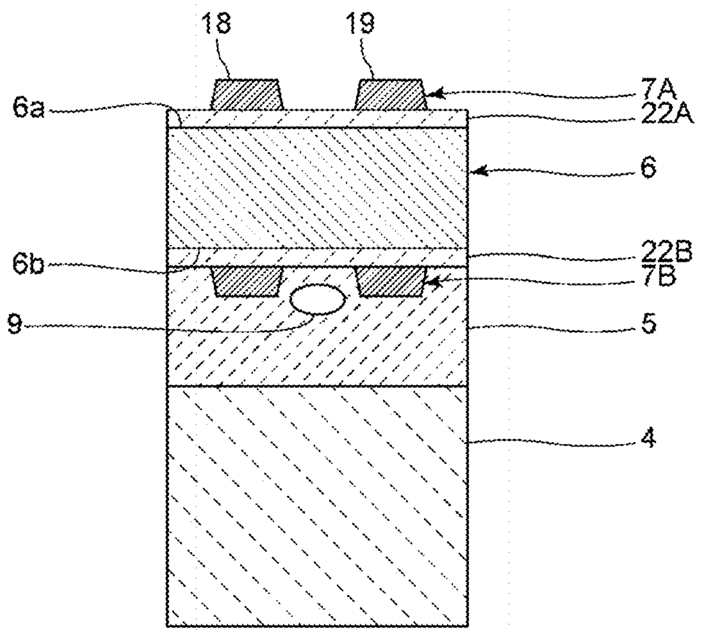
FIG. 12 is a schematic elevational cross-sectional view illustrating the vicinity of the pair of electrode fingers of each of the first IDT electrode and the second IDT electrode in the acoustic wave device according to a second modified example of the first preferred embodiment of the present invention.

In a second modified example illustrated in FIG. 12, an insulation layer 22A is provided between the first IDT electrode 7A and the piezoelectric layer 6. An insulation layer 22B is provided between the second IDT electrode 7B and the piezoelectric layer 6. As the material of the insulation layer 22A and the insulation layer 22B, for example, silicon nitride, silicon oxide, tantalum oxide, alumina, silicon oxynitride, or the like can be used.

Figure 13:
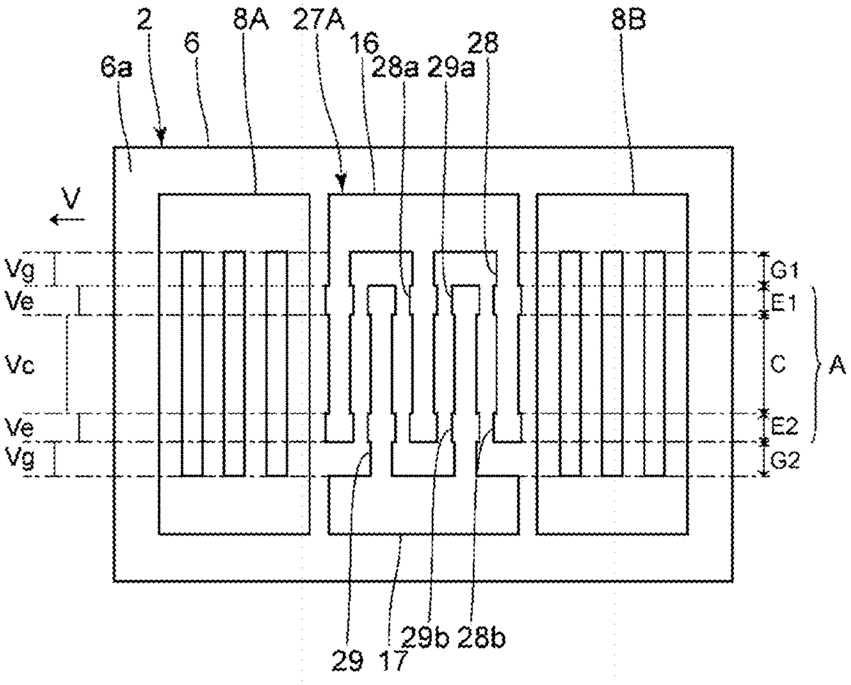
FIG. 13 is a schematic plan view of the acoustic wave device according to a third modified example of the first preferred embodiment of the present invention.

In a third modified example illustrated in FIG. 13, a piston mode is used. To be more specific, an intersection region A of a first IDT electrode 27A includes a central region C and a pair of edge regions. The pair of edge regions is a first edge region E1 and a second edge region E2. The central region C is a region located on a central side in an electrode finger extending direction. The first edge region E1 and the second edge region E2 face each other with the central region C in between in the electrode finger extending direction. Further, the first IDT electrode 27A includes a pair of gap regions. The pair of gap regions is a first gap region G1 and a second gap region G2. The first gap region G1 is located between the first busbar 16 and the intersection region A. The second gap region G2 is located between the second busbar 17 and the intersection region A.

A plurality of first electrode fingers 28 each includes a wide portion 28*a* located in the first edge region E1 and a wide portion 28*b* located in the second edge region E2. In each electrode finger, the width of the wide portion is wider than the width of the other portions. Similarly, a plurality of second electrode fingers 29 each includes a wide portion 29*a* located in the first edge region E1 and a wide portion 29*b* located in the second edge region E2. Note that the width of the electrode finger is a dimension of the electrode finger along the acoustic wave propagation direction.

In the first IDT electrode 27A, since the wide portion 28*a* and the wide portion 29*a* are provided as described above, an acoustic velocity in the first edge region E1 is lower than an acoustic velocity in the central region C. Further, since the wide portion 28*b* and the wide portion 29*b* are provided, an acoustic velocity in the second edge region E2 is lower than the acoustic velocity in the central region C. That is, a pair of low acoustic velocity regions is formed in the pair of edge regions. The low acoustic velocity region is a region in which an acoustic velocity is lower than the acoustic velocity in the central region C.

In contrast, in the first gap region G1, only the plurality of first electrode fingers 28 are provided, of the plurality of first electrode fingers 28 and the plurality of second electrode fingers 29. In the second gap region G2, only the plurality of second electrode fingers 29 are provided, of the plurality of first electrode fingers 28 and the plurality of second electrode fingers 29. Thus, the acoustic velocities in the first gap region G1 and the second gap region G2 are higher than the acoustic velocity in the central region C. That is, a pair of high acoustic velocity regions is formed in the pair of gap regions. The high acoustic velocity region is a region in which an acoustic velocity is higher than the acoustic velocity in the central region C.

Here, when the acoustic velocity in the central region C is represented by Vc, the acoustic velocity in the first edge region E1 and the second edge region E2 is represented by Ve, and the acoustic velocity in the first gap region G1 and the second gap region G2 is represented by Vg, the relationship between the acoustic velocities is $Vg>Vc>Ve$. Note that, in the portion in FIG. 13 indicating the relationship between the acoustic velocities, as indicated by an arrow V, the acoustic velocity increases as the line indicating the height of each acoustic velocity is located on the left side. From the center in the electrode finger extending direction, the central region C, the pair of low acoustic velocity regions, and the pair of high acoustic velocity regions are arranged in this order. Accordingly, the piston mode is established. As a result, a transverse mode can be suppressed.

It is sufficient that at least one electrode finger of the plurality of first electrode fingers 28 and the plurality of second electrode fingers 29 may have a wide portion in at least one of the first edge region E1 and the second edge region E2. However, it is preferable that all the first electrode fingers 28 have the wide portion 28*a* and the wide portion 28*b* in both of the edge regions, and all the second electrode fingers 29 have the wide portion 29*a* and the wide portion 29*b* in both of the edge regions.

In the present preferred embodiment, the second IDT electrode is also configured in the same manner as the first IDT electrode 27A. That is, in the second IDT electrode, the plurality of first electrode fingers and the plurality of second electrode fingers have wide portions located in both edge regions. However, it is sufficient that the low acoustic velocity region is provided in at least one of the first edge region and the second edge region in at least one of the first IDT electrode 27A and the second IDT electrode.

Figure 14:
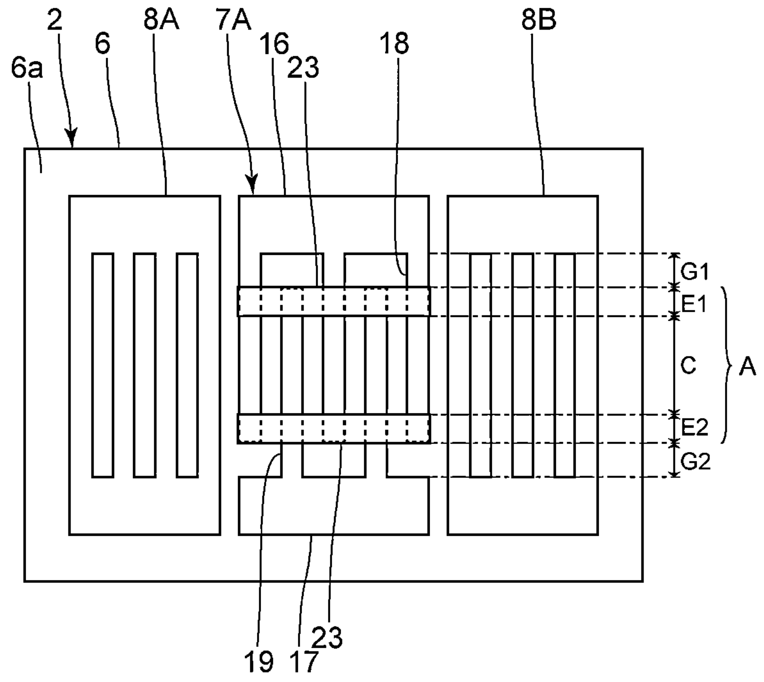
FIG. 14 is a schematic plan view of the acoustic wave device according to a fourth modified example of the first preferred embodiment of the present invention.

In a fourth modified example illustrated in FIG. 14, mass addition films 23 are provided in the respective edge regions. Each of the mass addition films 23 has a belt-shaped structure. Each of the mass addition films 23 is provided over a plurality of electrode fingers. Each of the mass addition films 23 is also provided in a portion between the electrode fingers on the piezoelectric layer 6. Note that each of the mass addition films 23 may be provided between the plurality of electrode fingers and the piezoelectric layer 6. It is sufficient that each of the mass addition films 23 overlaps the plurality of electrode fingers in plan view. Alternatively, a plurality of mass addition films may be provided, and the mass addition films may overlap the respective electrode fingers in plan view. Thus, a pair of low acoustic velocity regions can be provided in the pair of edge regions. It is sufficient that the mass addition film 23 is provided on at least one of a first principal surface 6*a* side and a second principal surface 6*b* side of the piezoelectric layer 6.

Alternatively, for example, the thickness of the plurality of electrode fingers in the pair of edge regions may be thicker than the thickness in the central region. Also in this case, the pair of low acoustic velocity regions can be provided in the pair of edge regions. Alternatively, for example, the first IDT electrode or the second IDT electrode may have a configuration in which the cavity is provided in the busbar and the piston mode is used, as described in International Publication No. 2016/084526.

Figure 15:
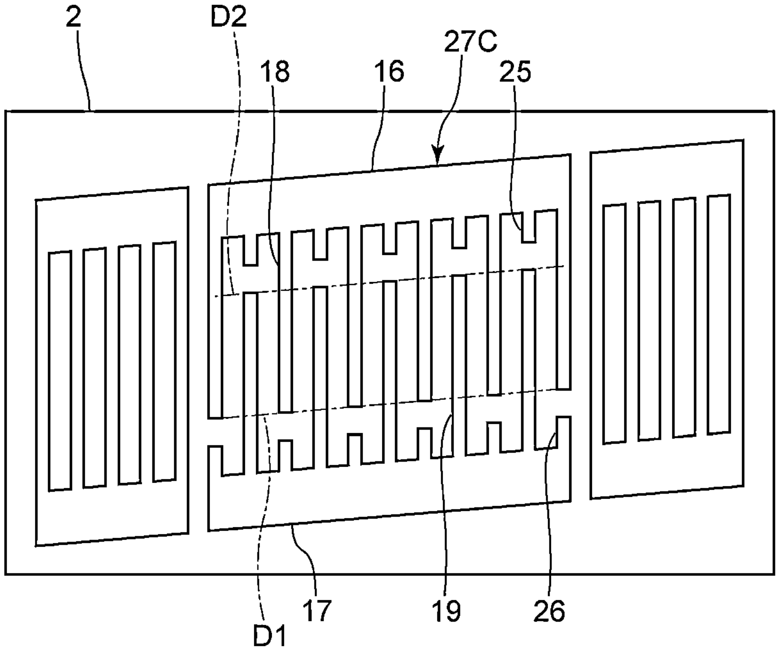
FIG. 15 is a schematic plan view of the acoustic wave device according to a fifth modified example of the first preferred embodiment of the present invention.

In a fifth modified example illustrated in FIG. 15, a first IDT electrode 27C is an inclined IDT electrode. To be more specific, when a virtual line formed by connecting the tips of the plurality of first electrode fingers 18 is defined as a first envelope D1, the first envelope D1 is inclined with respect to the acoustic wave propagation direction. Similarly, when a virtual line formed by connecting the tips of the plurality of second electrode fingers 19 is defined as a second envelope D2, the second envelope D2 is inclined with respect to the acoustic wave propagation direction.

The first IDT electrode 27C includes a plurality of first dummy electrode fingers 25 and a plurality of second dummy electrode fingers 26. One end of each of the plurality of first dummy electrode fingers 25 is connected to the first busbar 16. The other end of each of the plurality of first dummy electrode fingers 25 faces each of the plurality of second electrode fingers 19 with a gap in between. One end of each of the plurality of second dummy electrode fingers 26 is connected to the second busbar 17. The other end of each of the plurality of second dummy electrode fingers 26 faces each of the plurality of first electrode fingers 18 with a gap in between. However, the plurality of first dummy electrode fingers 25 and the plurality of second dummy electrode fingers 26 do not have to be provided.

Figure 16:
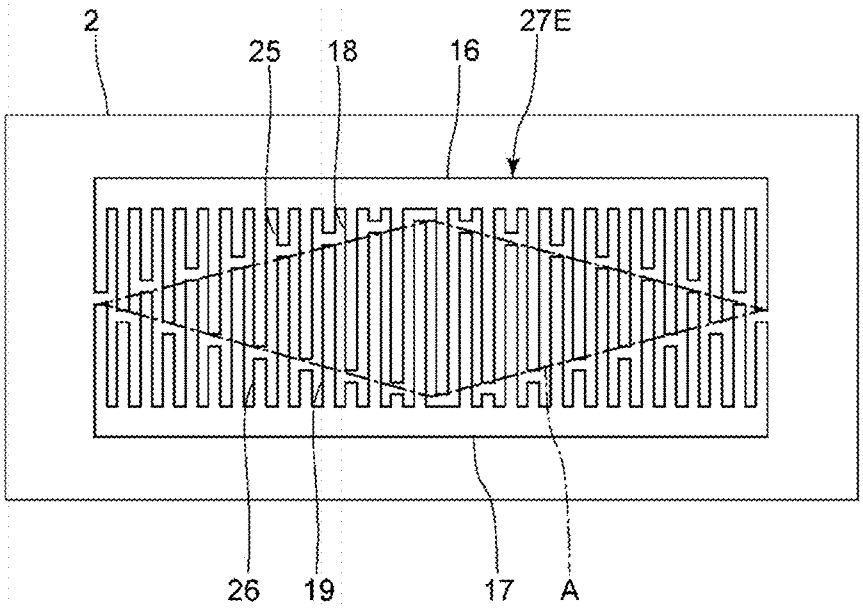
FIG. 16 is a schematic plan view of the acoustic wave device according to a sixth modified example of the first preferred embodiment of the present invention.

In a sixth modified example illustrated in FIG. 16, a first IDT electrode 27E is an apodized IDT electrode. To be more specific, when a dimension of the intersection region A along the electrode finger extending direction is referred to as an intersecting width, the intersecting width of the first IDT electrode 27E varies in the acoustic wave propagation direction. The intersecting width decreases from the center of the first IDT electrode 27E in the acoustic wave propagation direction toward an outer side portion. The intersection region A has a substantially rhombic shape in plan view. However, the shape of the intersection region A in plan view is not limited to the above.

Also in the present modified example, a plurality of dummy electrode fingers is provided. The lengths of the plurality of dummy electrode fingers are different from each other and the lengths of the plurality of electrode fingers are different from each other. Thus, the intersecting width changes as described above. The lengths of the dummy electrode fingers and the lengths of the electrode fingers have dimensions that extend along the electrode finger extending direction of the dummy electrode fingers and the electrode fingers. Note that, in FIG. 16, the reflector is omitted.

Figure 17:
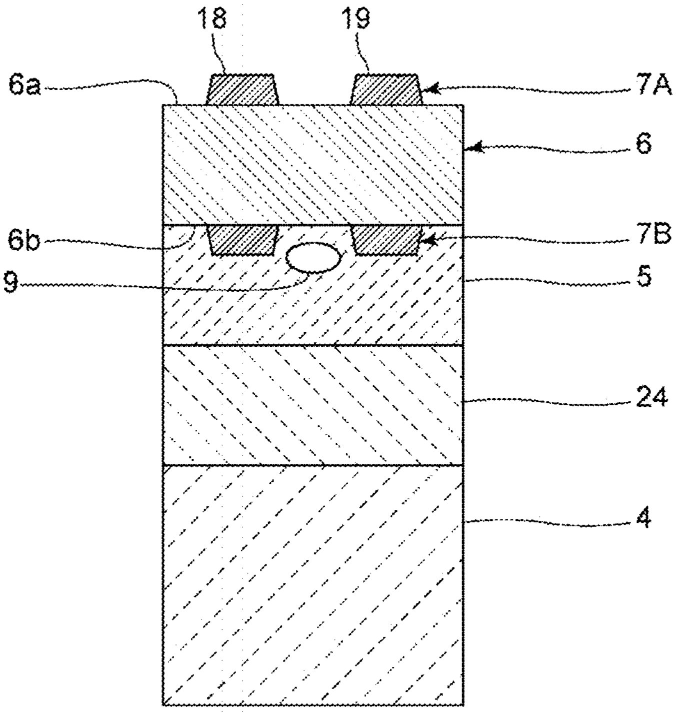
FIG. 17 is a schematic cross-sectional view of the acoustic wave device according to a seventh modified example of the first preferred embodiment of the present invention.

In a seventh modified example illustrated in FIG. 17, a plurality of dielectric layers is provided between the support substrate 4 and the piezoelectric layer 6. More specifically, one of the plurality of dielectric layers is a high acoustic velocity layer 24. The high acoustic velocity layer 24 is provided on the support substrate 4. The dielectric layer 5 is provided on the high acoustic velocity layer 24. The piezoelectric layer 6 is provided on the dielectric layer 5.

The high acoustic velocity layer 24 is a layer having a relatively high acoustic velocity. An acoustic velocity of a bulk wave propagating through the high acoustic velocity layer 24 is higher than an acoustic velocity of an acoustic wave propagating through the piezoelectric layer 6. In the present preferred embodiment, the high acoustic velocity layer 24 is a silicon nitride layer. However, the material of the high acoustic velocity layer 24 is not limited to what is described above, for example, a medium including the above material as a main component, such as silicon, aluminum oxide, silicon carbide, silicon oxynitride, sapphire, lithium tantalate, lithium niobate, a quartz crystal, alumina, zirconia, cordierite, mullite, steatite, forsterite, magnesia, a diamond-like carbon (DLC) film, diamond, or the like can be used.

Note that the support substrate 4, the dielectric layer and the high acoustic velocity layer 24 may be laminated in this order. The number of layers of the dielectric layers is not particularly limited. At least one dielectric layer may be provided between the support substrate 4 and the piezoelectric layer 6. In this case, it is preferable that the dielectric layer closest to the piezoelectric layer 6 side be provided with the cavity 9.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:

a support including a support substrate;

a piezoelectric layer provided on the support and including a first principal surface and a second principal surface facing each other;

a first IDT electrode provided on the first principal surface and including a plurality of electrode fingers; and a second IDT electrode provided on the second principal surface and including a plurality of electrode fingers; wherein the second IDT electrode is embedded in the support; and at least one cavity is provided in a periphery of a portion of the support in which the plurality of electrode fingers of the second IDT electrode is embedded.

2. The acoustic wave device according to claim 1, wherein at least a portion of the plurality of electrode fingers of the first IDT electrode and at least a portion of the plurality of electrode fingers of the second IDT electrode overlap each other in plan view, and the electrode fingers overlapping each other in plan view are connected to a same potential.

3. The acoustic wave device according to claim 1, wherein the support includes a dielectric layer provided between the support substrate and the piezoelectric layer; and the at least one cavity is provided in the dielectric layer.

4. The acoustic wave device according to claim 3, wherein the dielectric layer includes silicon oxide, silicon nitride, silicon oxynitride, lithium oxide, or tantalum pentoxide.

5. The acoustic wave device according to claim 1, wherein when a wavelength defined by an electrode finger pitch of the first IDT electrode is represented by A, a distance between the at least one cavity and an electrode finger, of the plurality of electrode fingers of the second IDT electrode, closest to the at least one cavity is equal to or less than about 1λ.

6. The acoustic wave device according to claim 1, wherein when a wavelength defined by an electrode finger pitch of the first IDT electrode is represented by λ, a maximum dimension of the at least one cavity is equal to or less than about 1λ.

7. The acoustic wave device according to claim 1, wherein the at least one cavity has an elliptically spherical shape or a substantially elliptically spherical shape.

8. The acoustic wave device according to claim 1, wherein the acoustic wave device is structured to generate a shear horizontal mode wave.

9. The acoustic wave device according to claim 1, further comprising reflectors on both sides of the first IDT electrode and the second IDT electrode, wherein the acoustic wave device is a surface acoustic wave resonator.

10. The acoustic wave device according to claim 1, wherein the piezoelectric layer is a lithium tantalate layer.

11. The acoustic wave device according to claim 1, wherein the support substrate is a silicon substrate.

12. The acoustic wave device according to claim 11, wherein the silicon has a diamond structure.

13. The acoustic wave device according to claim 1, further comprising a dielectric film on the first principal surface of the piezoelectric layer to cover the first IDT electrode.

14. The acoustic wave device according to claim 13, wherein the dielectric film includes silicon oxide, silicon nitride, or silicon oxynitride, and a thickness of the dielectric film is less than a thickness of the first IDT electrode.

15. The acoustic wave device according to claim 1, further comprising a first insulation layer between the first IDT electrode and the piezoelectric layer and a second insulation layer between the second IDT electrode and the piezoelectric layer.

16. The acoustic wave device according to claim 1, wherein the acoustic wave device is structured to generate a piston mode.

17. The acoustic wave device according to claim 1, further comprising a mass addition film provided in edge regions of the first IDT electrode.

18. The acoustic wave device according to claim 1, wherein the first IDT electrode is an inclined IDT electrode.

19. The acoustic wave device according to claim 1, wherein the first IDT electrode is an apodized IDT electrode.

20. The acoustic wave device according to claim 1, further comprising a plurality of dielectric layers between the support substrate and the piezoelectric layer.

* * * * *